United States Patent
Mingo Bisquert et al.

(10) Patent No.: US 8,962,970 B2
(45) Date of Patent: Feb. 24, 2015

(54) MICROSTRUCTURE FOR A SEEBECK EFFECT THERMOELECTRIC GENERATOR, AND METHOD FOR MAKING SUCH A MICROSTRUCTURE

(75) Inventors: Natalio Mingo Bisquert, Sassenage (FR); Tristan Caroff, Brest (FR); Marc Plissonnier, Eybens (FR); Vincent Remondiere, Grenoble (FR); Shidong Wang, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/297,540

(22) Filed: Nov. 16, 2011

(65) Prior Publication Data

US 2012/0060888 A1    Mar. 15, 2012

Related U.S. Application Data

(63) Continuation of application No. PCT/FR2010/050904, filed on May 11, 2010.

(30) Foreign Application Priority Data

Jun. 12, 2009  (FR) ...................................... 09 53930

(51) Int. Cl.
*H01L 37/00* (2006.01)
*H01L 35/34* (2006.01)
(Continued)

(52) U.S. Cl.
CPC ................ *H01L 35/32* (2013.01); *H01L 35/34* (2013.01)
USPC ......................................... 136/201; 136/205

(58) Field of Classification Search
CPC ........................................................ H01L 35/10
USPC .................. 136/244, 224, 201, 205, 212, 230
See application file for complete search history.

(56) References Cited

U.S. PATENT DOCUMENTS 6,872,879 B1    3/2005  Serras et al.
2003/0089391 A1*  5/2003  Fukudome et al. ........... 136/227
(Continued)

FOREIGN PATENT DOCUMENTS

JP    2004-104041 A1    4/2004
JP    2004-179480 A1    6/2004
(Continued)

OTHER PUBLICATIONS

G. Jeffrey Snyder, et al., "*Thermoelectric Microdevice Fabricated by a MEMS-Like Electrochemical Process*," Nature Materials, vol. 2, Aug. 2003, pp. 528-531.

*Primary Examiner* — Eli Mekhlin
(74) *Attorney, Agent, or Firm* — Burr & Brown, PLLC

(57) ABSTRACT

A method for making a thermoelectric microstructure includes: forming an insulating substrate; forming, on the substrate, a first assembly of conductor or semiconductor elements extending in parallel and in a first direction from first to second connection areas, and having a first Seebeck coefficient; forming, on the substrate, a second assembly of conductor or semiconductor elements electrically insulated from the first assembly and extending in parallel and in a second direction other than the first one, from the first to second connection areas, and having a second Seebeck coefficient other than the first one; providing, in the first and second connection areas, electric connection elements, each of which electrically connects at least one element of first and second assemblies; two conductor or semiconductor elements of a single assembly are separated in a predetermined direction by a predetermined average distance in the connection areas.

5 Claims, 3 Drawing Sheets

(51) Int. Cl.
*H01L 35/30* (2006.01)
*H01L 35/32* (2006.01)

(56) References Cited

U.S. PATENT DOCUMENTS

| | | |
|---|---|---|
| 2005/0178424 A1 | 8/2005 | Yotsuhashi et al. |
| 2005/0241690 A1* | 11/2005 | Tajima et al. .................. 136/212 |
| 2006/0107989 A1* | 5/2006 | Bierschenk et al. ........... 136/212 |
| 2008/0173537 A1 | 7/2008 | DeSteese et al. |
| 2009/0025774 A1 | 1/2009 | Plissonnier et al. |
| 2011/0209739 A1* | 9/2011 | Pingree et al. ................. 136/205 |
| 2012/0060888 A1* | 3/2012 | Mingo Bisquert et al. ... 136/224 |

FOREIGN PATENT DOCUMENTS

| | | |
|---|---|---|
| JP | 2008-205129 A1 | 9/2008 |
| WO | 80/01438 A1 | 7/1980 |
| WO | 00/30185 A1 | 5/2000 |

* cited by examiner

MICROSTRUCTURE FOR A SEEBECK EFFECT THERMOELECTRIC GENERATOR, AND METHOD FOR MAKING SUCH A MICROSTRUCTURE

FIELD OF THE INVENTION

The invention relates to the field of Seebeck effect thermoelectric microgenerators, in other words structures that convert heat energy into electric energy, and the functional elements of which are smaller than one millimetre.

BACKGROUND OF THE INVENTION

The function of Seebeck effect thermoelectric generators is to convert a temperature gradient to which they are subjected into electric current. Such a property is used for example for current generation as such, but also to cool or to measure temperature or heat flow. Thermoelectric generators are thus commonly used in MicroElectroMechanical systems, better known by the acronym MEMS.

To produce an electric current from a temperature gradient, an assembly of junctions is created using materials with different Seebeck coefficients connected electrically in series and thermally in parallel, such as p-n junctions connected in series for example.

Whatever type of structures is used for these connections, whether they are planar structures, as in the document U.S. Pat. No. 6,872,879, or column structures, as in the document "Thermoelectric microdevice fabricated by a MEMS-like electrochemical process" by G. Jeffery Snyder et al, Nature materials, vol. 2, August 2003, www.nature.com/naturematerial, the microscopic nature of the different elements (conductor or semiconductor elements forming junctions or connection elements for example of dimension smaller than one millimetre) usually compels very precise alignment processes in order to make said junctions in such a way as to obtain a long series of junctions, as a guarantee of thermoelectric efficiency. In fact, a great many steps using precision equipment need to be implemented in order to make a thermoelectric microstructure. In fact prior art thermoelectric microstructures are generally expensive and take a long time to make.

BRIEF DESCRIPTION OF THE INVENTION

The purpose of this invention is to propose a straightforward method for making a thermoelectric microstructure which does not require the use of very precise alignment, while furthermore guaranteeing said structure increased sturdiness relative to a junction failure.

To this end, the object of the invention is a method for making a Seebeck effect theinioelectric microstructure, comprising the following steps:
  forming an insulating substrate provided with a first and second connection area;
  forming, on the substrate, a first assembly of conductor or semiconductor elements extending in parallel and in a first direction from the first connection area to the second connection area, said elements having a first Seebeck coefficient;
  forming, on the substrate, a second assembly of conductor or semiconductor elements electrically insulated from the elements of the first assembly and extending in parallel, and in a second direction other than the first direction, from the first connection area to the second connection area, the elements of the second assembly having a second Seebeck coefficient other than the first Seebeck coefficient; and,
  providing, in the first and second connection areas of the substrate, electric connection elements, the dimensions of which are selected in such a way that each of said connection elements is capable of electrically connecting at least one element of the first assembly with at least one element of the second assembly.

According to the invention:
  two conductor or semiconductor elements of a single assembly are separated in a predetermined direction by a predetermined average distance in the connection areas;
  the average dimension of the connection elements in the predetermined direction is greater than the maximum of the average distances between the elements of a single assembly; and
  the distance in the predetermined direction between the edges of two connection elements is less than the minimum of the average distances between the elements of a single assembly.

Put another way, during a first phase in the making of the inventive microstructure, the elements are formed which will subsequently be used for the junctions without necessarily worrying about their alignment in the single assembly and regardless of the precise relative orientation of the first assembly with the second assembly. In a second phase, these elements are then interconnected to form junctions using connectors the average dimensions of which are greater than twice the spacing between the elements in the connection areas. By proceeding in this way, it is then certain that a plurality of junctions will be formed that are electrically in series. Additionally, because of the considerable size of the connectors, a plurality of series of junctions is also made in parallel, in such a way that if a junction were to break, there is still a parallel path for the current.

Whereas in the prior art the aim is to obtain one and only one electric series of junctions, requiring in fact a precise alignment of the elements, the invention takes advantage of the fact that connecting together more than two adjacent elements is in no way disadvantageous, and quite the reverse results in greater sturdiness. Thus, in the invention, it will be advantageous to seek a maximum density of electrical connections, in order in particular to multiply the parallel electric paths and therefore, ultimately, to increase the sturdiness of the structure, but also to dispense as far as possible with any need for precise positioning of these connections relative to the elements constituting the junctions. Since there is thus no requirement to seek a connection of only two elements, the method does not therefore need a high level of precision, which simplifies the making of the microstructure.

According to the invention, the first and second assemblies may be formed on opposite faces respectively of the insulating substrate, the formation of the connection elements including the provision of electrical connections that pass through the substrate between the two faces, and in particular the formation of at least one hole passing through the substrate followed by the formation of conductor contacts in this hole.

To be more specific, the average dimension of the connection elements in the predetermined direction is greater than twice the maximum of the average distances between the elements of a single assembly.

According to another inventive configuration, the conductor or semiconductor elements are bands, wires, nanowires, and/or single crystal fibres.

As an alternative, they may be constituted by a thin film having anisotropic electrical conductivity.

A further purpose of the invention is a microstructure for a Seebeck effect thermoelectric generator comprising:

an insulating substrate provided with a first connection area and a second connection area;

on the substrate, a first assembly of conductor or semiconductor elements extending in parallel and in a first direction between the first connection area and the second connection area, said elements having a first Seebeck coefficient;

on the substrate, a second assembly of conductor or semiconductor elements electrically insulated from the first assembly, extending in parallel and in a second direction other than the first direction, from the first connection area to the second connection area, the elements of the second assembly having a second Seebeck coefficient other than the first Seebeck coefficient; and in the first and second connection areas, electric connection elements electrically connecting at least one element of the first assembly with at least one element of the second assembly.

According to the invention:

two conductor or semiconductor elements of a single assembly are separated in a predetermined direction by a predetermined average distance in the connection areas;

the average dimension of the connection elements in the predetermined direction is greater than the maximum of the average distances between the elements of a single assembly; and the distance in the predetermined direction between the edges of two connection elements is less than the minimum of the average distances between the elements of a single assembly.

Such a structure, made according to the aforementioned method, is sturdy and easy to make.

BRIEF DESCRIPTION OF THE FIGURES

The invention will be better understood from reading the following description, given solely by way of example, and provided in relation to the appended drawings, wherein.

DETAILED DESCRIPTION OF THE INVENTION

Here below the expressions "top", "bottom", "right" and "left" are defined relative to FIG. 1.

Figure 1:
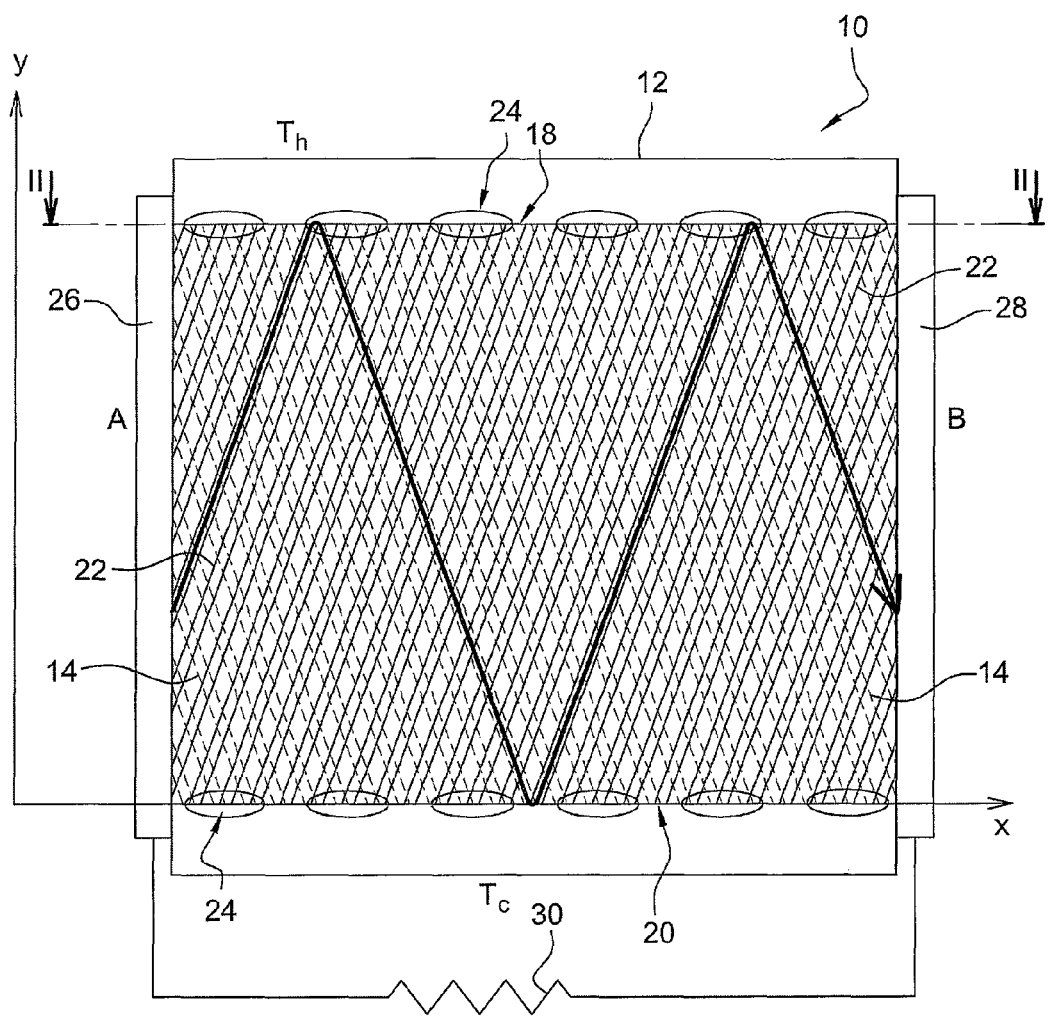
FIG. 1 is a diagrammatic view from the front of a thermoelectric microstructure according to the invention.
Figure 2:
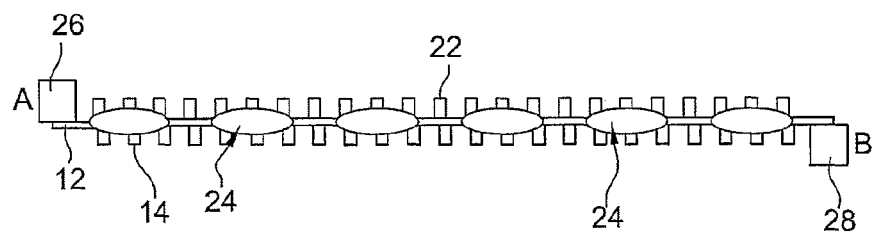
FIG. 2 is a diagrammatic cross-section view along the axis II-II in the microstructure in FIG. 1.

In FIGS. 1 and 2, a first embodiment of a Seebeck effect thermoelectric microstructure 10, made for example using thin layer technology, as used in microelectronics, according to the invention includes:

a thin substrate of insulating material 12, for example a substrate or a thin film;

an assembly of bands 14 made of a conductor or semiconductor material, implemented on a first face of the insulating substrate 12. The bands 14, formed substantially parallel relative to each other and evenly spaced apart, extend from a first area 18 of the substrate 12, arranged on the top edge thereof, to a second area 20 of the substrate 12, arranged on the bottom edge thereof;

an assembly of bands 22 made of a conductor or semiconductor material (shown in dotted lines), implemented on a second face of the substrate 12, opposite to the first face. The bands 22, also formed substantially parallel relative to each other and evenly spaced apart, extend from the first area 18 to the second area 20. The bands 22 have furthermore a direction other than that of the bands 14;

an assembly of metal connection contacts 24, passing through the insulating substrate 12 and implemented in the areas 18 and 20. The metal contacts 24, of elliptical cross-section for example, are evenly spaced apart and electrically connect together bands 14, 22, of the first and second assemblies; and metal collector contacts 26, 28 formed along the left and right edges of the substrate 12, the metal collector contact 26 being in contact only with bands 14 and the metal collector contact 28 being only in contact with bands 22.

The materials of the bands 14 and 22 are different so as to have different Seebeck coefficients. For example, the bands 14 are made of a P-type semiconductor material, which has a positive Seebeck coefficient, and the bands 22 are made of an N-type semiconductor material, which has a negative Seebeck coefficient. The semiconductor materials of the bands 14, 22 are chosen for example from among solid solutions of $Bi_2Te_3$, $Bi_2Se_3$ and $Sb_2Te_3$, materials based on Si or SiGe, silicides, germanides, solid solutions based on $Mg_2Si$, $Mg_2Ge$ or $Mg_2Sn$, or again other materials such as PbTe or $PbSe_xTe_{1-x}$.

Preferably, the materials of the bands 14 and 22 are selected to have a difference of Seebeck coefficients in absolute value greater than 200 μV/K. In this way these materials have a wide ZT coefficient, and more specifically a ZT coefficient that is greater than or equal to 1. As is known, the ZT coefficient characterises the thermoelectric quality of a material and is conventionally designated as the "figure of merit" of the material.

The bands 14, 22 are obtained for example by scratching, the substrate then having conductor or semiconductor layers coated with an insulating material, by combing, or long band removal of a thin film, as is known from the prior art.

It will thus be noted that the microstructure 10 has an assembly of junctions of materials having different Seebeck coefficients, for example PN junctions implemented by the metal contacts 24, said junctions being arranged electrically in series and thermally in parallel between the metal collector contacts 26, 28.

To advantage, a metal connection contact 24 connects a plurality of bands 14 of the first assembly with a plurality of bands 22 of the second assembly. There is therefore a plurality of parallel and independent paths for the current between the metal collector contacts 26 and 28.

Thus, by subjecting the top and bottom edges of the microstructure 10 to different temperatures $T_h$ and $T_c$ and by connecting the collector contacts 26, 28 to a charge 30 in order to create a closed circuit, a current is then generated by Seebeck effect and flows along the electric paths formed of junctions in series, such as for example the path shown in bold in FIG. 1.

Preferably, the metal connection contacts 24 connect more than two adjacent bands of the same assembly in the plane of the substrate 12, and for example three or four adjacent bands, with the result that a plurality of arrangements of junctions in parallel are created. There are therefore, for an electric path between the collector contacts 26, 28, branches thereof constituted by a plurality of junctions in parallel between the connection areas 18, 20. If a junction or a constituent element thereof becomes defective, there is then always another valid junction for the current.

Figure 3:
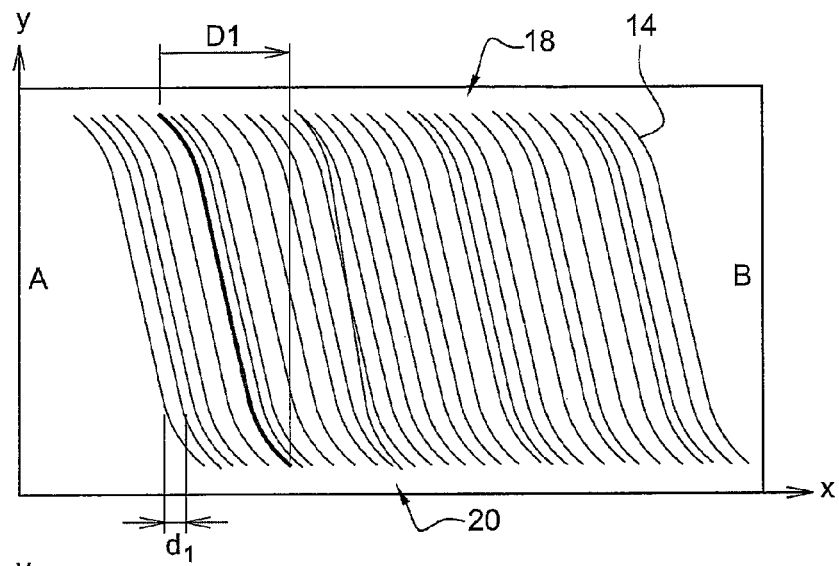
FIGS. 3 and 4 are diagrammatic views showing layouts of the conductor or semiconductor elements in the inventive microstructure.

In a preferred embodiment, the density of the bands per unit of area is high so as to obtain a high density of junctions per unit of volume, which increases the voltage at the terminals of the collector contacts 26, 28 thereby giving a thermoelectric microstructure that can be used in applications requiring large amounts of electric power. Although rectilinear bands have been described, other forms of bands are possible. FIG. 3 shows for example an alternative form of the layout of the bands 14. The bands 14 may thus take any form, such as an "S" shape for example. Although rectilinear layouts are preferred for reasons of simplicity and manufacturing cost, non-rectilinear forms may be preferred, in order for example to bypass a functionalised area of the insulating substrate 12, such as a connection, a connecting area or the like.

Figure 4:
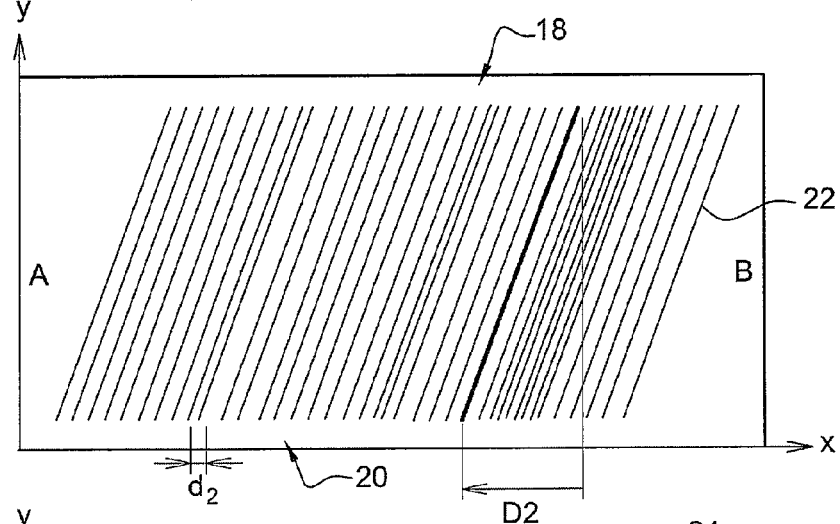

Likewise, parallel, evenly spaced bands have been described. As may be seen in FIGS. 3 and 4, the bands 14 (FIG. 3) and the bands 22 (FIG. 4) may have a variability in their spacing or in their parallelism to the extent that they may cross each other.

Likewise, the differences in direction between the bands 14 of the first assembly and the bands 22 of the second assembly may be very variable. By defining a band offset as the distance along the axis of the x-coordinates ("x" axis) separating its end in the connection area 18 from its end in the connection area 20, the offset D1 of the bands 14 of the first assembly is of same sign or of sign different from the offset D2 of the bands 22 of the second assembly, but still different. For example, the offsets D1 and D2 are chosen in such a way that over the distance between the connection areas 18, 20, the bands 14 of the first assembly cross the bands 22 of the second assembly.

Likewise, bands have been described. As an alternative, any other type of longilinear conductor or semiconductor elements is appropriate. For example, wires, nanowires, or fibrous single crystals are used. In this alternative, the wires, nanowires or fibrous single crystals are dispersed over the substrate 12 and then aligned by an electric field, for example by means of electrophoresis technology. As an alternative, a thin film having anisotropic electrical conductivity may be used on each face of an insulating substrate, each film having an axis of maximum current conduction in an appropriate direction.

As an alternative, the elements of the first assembly are constituted by a thin film and the elements of the second assembly by bands. However, bands are preferred since their directions of anisotropy are clear. On the other hand, a film may be preferred for its simplicity of implementation.

Likewise, bands have been described with the ends thereof being aligned so that the connection areas 18 and 20 are rectilinear. As an alternative, the ends of the bands may follow meandering layouts, in order for example to avoid specific areas of the substrate.

Likewise, a double-faced microstructure has been described wherein the bands 14 made of a first type of material are separated from the bands 22 made of a second type of material by an insulating substrate 12. The use of said substrate enables in particular an insulation of the bands 14 relative to the bands 22 that is effective and straightforward to implement. As an alternative, the bands 14 and 22 are implemented on the same face of the insulating substrate 22 ensuring that the bands 14 are electrically insulated from the bands 22 during the formation thereof in order to avoid any short-circuit phenomenon. For example, the bands are elements of the nanowire type constituted by a core made of conductor or semiconductor material coated with an insulating material. The contacts 24 are then made for example by boring followed by a metallization step (filling or lining the holes with a metal) of the holes so created. Boring then exposes the core of the nanowires thereby allowing the formation of the junctions.

Figure 5:
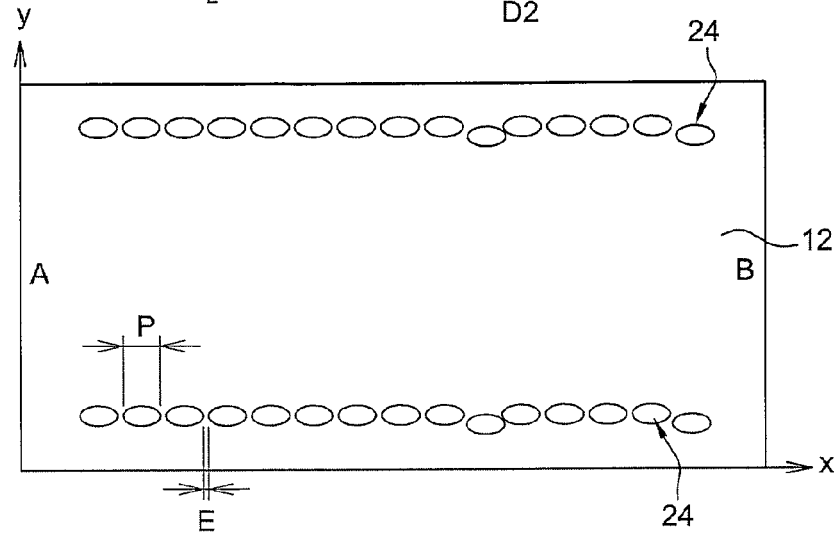
FIG. 5 is a diagrammatic view from the front of an insulating substrate provided with contact orifices intended to be combined with the layouts in FIGS. 3 and 4.

In a general way, a preferred method of manufacturing a microstructure according to the invention, comprises:

forming parallel bands 14, 22 between the connection areas 18 and 20 with an average respective spacing $d_1$ and $d_2$ (FIG. 3 et 4) such that $d_1 \leq |D1-D2|$ and $d_2 \leq |D1-D2|$ and forming metal contacts 24, whereof the width P (FIG. 5) has an average value $\overline{P}$ greater than $\max(d_1,d_2)$ and a variability $\Delta P$ such that:

$$\overline{P} - \Delta P > \max(d_1, d_2)$$

and whereof the spacing E, i.e. the distance separating two adjacent edges of two contacts 24, is preferably less than $\min(d_1,d_2)$ and to advantage as small as possible without the metal contacts 24 touching. To advantage, $\overline{P} > \max(2d_1, 2d_2)$ so as to connect together a plurality of bands of a single assembly.

By proceeding in this way, there is a certainty of obtaining at least one current path, and if the width P of the contacts 24 is increased and/or the spacing $d_1$ and $d_2$ of the bands 14, 22 reduced, a plurality of parallel electric paths is obtained.

It will be noted most specifically that it is not necessary to position the bands 14, 22 accurately relative to one another or relative to the metal contacts 24. It will thus be noted that the manufacturing method is sturdy in the sense that it allows variability in the dimensions or positioning of the different elements forming part of the constitution of the junctions. Materials with unrestrictive tolerances may thus be used and/or high production rates implemented with no fear of the variabilities induced by manufacture.

The contacts 24 are for example obtained by boring the insulating substrate 12 followed by filling or lining the holes so created with a metal. As an alternative, two longilinear openings are created. Individual metal contacts are then inserted therein or the openings are filled with metal and the longilinear metal contact so obtained is partitioned into distinct elements, for example by etching.

Furthermore, the metal collector contacts 26, 28 may extend over the entire height of the substrate 12 or only a part thereof, and/or include the corners of the substrate 12. Preferably, the collector contacts 26, 28 extend over a large part of the distance between the connection areas 18 and 20 so as to be in contact with a plurality of bands.

To advantage, a plurality of inventive thermoelectric microstructures may be combined in order to obtain a final two-dimensional structure, by juxtaposing a plurality of structures of the same type as that described in relation to FIG. 1, or three-dimensional.

Figure 6:
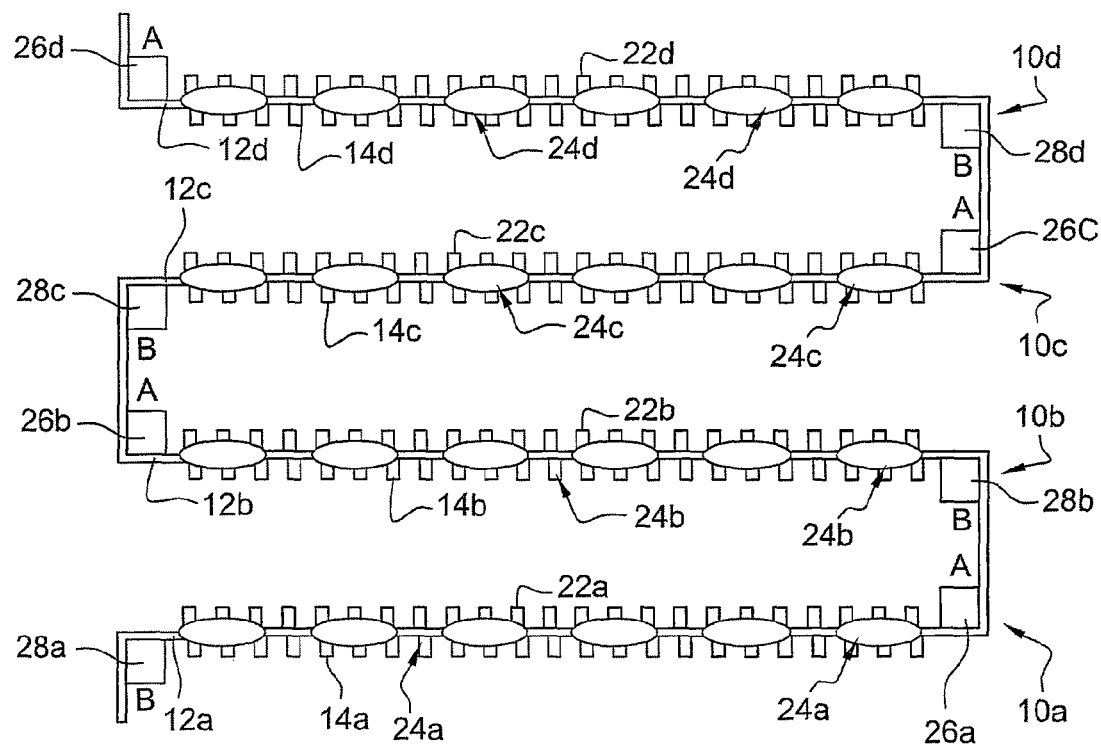
FIG. 6 is a diagrammatic view of a stack of inventive microstructures.

FIG. 6 shows for example a three-dimensional structure example obtained by combining four microstructures 10a, 10b, 10c, 10d, according to the invention, and for example microstructures identical to those in FIGS. 1 and 2.

A three-dimensional structure is thus obtained in a straightforward way by electrically connecting on the one hand the left-hand electric collector contacts 26a, 26b, 26c, 26d, and on the other hand the right-hand electric collector contacts 28a, 28b, 28c, 28d. The microstructures 10a, 10b, 10c, 10d are thus put in parallel, which strengthens the sturdiness of the assembly and increases the available electric power.

A numerical example of the implementation of a microstructure according to the invention will now be described.

A microstructure has been made that has:

an insulating substrate of 1.4 mm by 1.4 mm and with a thickness equal to 0.01 mm;

on one face of the substrate, n-type semiconductor wires made of $Bi_2Te_{2.7}Se_{0.3}$, with an average diameter equal to 0.002 mm, and arranged with a density of 400 wires per mm;

on the other face of the substrate, p-type semiconductor wires made of $Bi_{0.5}Sb_{1.5}Te_3$ also with an average diameter equal to 0.002 mm, and being arranged with a density of 400 wires per mm;

electrical connection contacts with an average width of 0.016 mm with an average spacing between two contacts equal to 0.004 mm. The contacts are made of nickel-plated bismuth telluride and therefore have a surface resistance of $10^{-9} \, \Omega m^{-2}$. Thus, on average 7 wires are connected to one contact.

The p-type wires are substantially rectilinear and have an average angle with a vertical axis of the substrate of 0.163 rad with a standard deviation of 0.1 rad. Likewise, the n-type wires are substantially rectilinear and have an average angle of −0.163 rad with a standard deviation of 0.1 rad.

The following table compares the electrical properties of the example of such a microstructure with those of the so-called "Thermolife" microstructure presented in the document "*Thermoelectric microdevice fabricated by a MEMS-like electrochemical process*" by G. Jeffery Snyder et al, Nature materials, vol. 2, August 2003, the electrical ratings of which can be found on the web-site http://www.poweredbythermolife.com/

|  | Maximum operating power ($\mu W/mm^2$) | Operating voltage ($V/mm^2$) | Operating current ($\mu A$) | Open circuit voltage ($V/mm^2$) |
|---|---|---|---|---|
| Invention | 0.68 | 0.171 | 5.75 | 0.228 |
| Thermolife | 0.442 | 0.0442 | 10.00 | 0.0884 |

By means of the invention, there is thus obtained:

a production method requiring no precise alignment, thereby allowing a high production output to be achieved for less cost;

a production method that allows the specificities of the substrate and the environment thereof to be taken into account by using where appropriate non-rectilinear conductor elements, so that some substrate areas can be bypassed for example;

a method for obtaining a double-faced or single face microstructure depending on the intended use;

a sturdy thermoelectric microstructure by putting a plurality of current paths in parallel;

a high voltage thermoelectric microstructure via a high junction density; and a thermoelectric microstructure capable of being combined in a straightforward way with other microstructures.

The invention claimed is:

1. A method for making a Seebeck effect thermoelectric microstructure, comprising the following steps:

forming an insulating substrate provided with a first and a second connection area, the insulating substrate having a first face and a second face;

forming a first assembly of conductor or semiconductor elements on the first face of the substrate, said elements extending in parallel and in a first direction from the first connection area to the second connection area, and said elements having a first Seebeck coefficient;

forming a second assembly of conductor or semiconductor elements electrically insulated from the elements of the first assembly on the second face of the substrate, said elements extending in parallel and in a second direction other than the first direction, from the first connection area to the second connection area, the elements of the second assembly having a second Seebeck coefficient other than the first Seebeck coefficient; and providing electric connection elements in the first and second connection areas of the substrate, said connection elements passing through the substrate to connect the conductor or semiconductor elements on the first face of the substrate with the conductor or semiconductor elements on the second face of the substrate, the dimensions of said connection elements being selected so that each of said connection elements electrically connects a plurality of elements of the first assembly with a plurality of elements of the second assembly, determining a first average of separation distances between respective adjacent pairs of conductor or semiconductor elements in a predetermined direction in the connection areas of the first assembly;

determining a second average of separation distances between respective pairs of adjacent conductor or semiconductor elements in the predetermined direction in the connection areas of the second assembly;

wherein the average dimension of connection elements in the predetermined direction is greater than the first average and the second average; and wherein a distance between adjacent connection elements in the predetermined direction is less than the first average and the second average.

2. The method for making a Seebeck effect thermoelectric microstructure as claimed in claim 1, wherein the first and second assemblies of conductor or semiconductor elements are formed on opposite faces respectively of the insulating substrate, and wherein the providing of the connection elements includes the formation of electrical connections passing through the substrate between said faces, and in particular the formation of at least one hole passing through the substrate followed by the formation of conductor contacts within said hole.

3. The method for making a Seebeck effect thermoelectric microstructure as claimed in claim 2, wherein the conductor or semiconductor elements of at least one assembly are constituted by a thin film having anisotropic electric conductivity, affixed to one of the faces of the insulating substrate, the film having an axis of maximum current conduction in a direction other than that of the elements of the other assembly.

4. The method for making a Seebeck effect thermoelectric microstructure as claimed in claim 1, wherein the conductor or semiconductor elements are constituted by bands, wires, nanowires, and/or single crystal fibres.

5. A microstructure for a Seebeck effect thermoelectric generator comprising:

an insulating substrate provided with a first connection area and a second connection area, the insulating substrate having a first face and a second face;

a first assembly of conductor or semiconductor elements extending in parallel on the first face of the substrate, and in a first direction, between the first connection area and the second connection area, said elements having a first Seebeck coefficient;

a second assembly of conductor or semiconductor elements electrically insulated from the elements of the first assembly, extending in parallel on the second face of the substrate, and in a second direction other than the first direction, from the first connection area to the second connection area, the elements of the second assembly having a second Seebeck coefficient other than the first Seebeck coefficient; and in the first and second connection areas, electric connection elements electrically passing through the substrate to connect the conductor or semiconductor elements on the first face of the substrate with conductor or semiconductor elements on the second face of the substrate, each connecting a plurality of elements of the first assembly with a plurality of elements of the second assembly, wherein a first average indicates the average of separation distances between respective adjacent pairs of conductor or semiconductor elements in a predetermined direction in the connection areas of the first assembly;

wherein a second average indicates the average of separation distances between respective pairs of adjacent conductor or semiconductor elements in the predetermined direction in the connection areas of the second assembly;

wherein the average dimension of connection elements in the predetermined direction is greater than the first average and the second average; and wherein a distance between adjacent connection elements in the predetermined direction is less than the first average and the second average.

* * * * *